(12) United States Patent
Vokey et al.

(10) Patent No.: US 6,459,271 B1
(45) Date of Patent: Oct. 1, 2002

(54) OPEN CABLE LOCATING FOR SHEATHED CABLES

(75) Inventors: David E. Vokey, Bellingham, WA (US); Gilles Aminot, Ile des Chenes (CA)

(73) Assignee: Norscan, Inc., Canover, NC (US)

( * ) Notice: Subject to any disclaimer, the term of this patent is extended or adjusted under 35 U.S.C. 154(b) by 4 days.

(21) Appl. No.: 09/709,420

(22) Filed: Nov. 13, 2000

(30) Foreign Application Priority Data

Jun. 27, 2000 (CA) .............................................. 2312509

(51) Int. Cl.⁷ .............................................. G01R 31/08
(52) U.S. Cl. ...................................................... 324/522
(58) Field of Search ................................ 324/512, 522, 324/523, 527, 528, 529, 544; 379/14.01, 29.05, 30, 22.03; 219/544, 553; 361/42, 62, 115

(56) References Cited

U.S. PATENT DOCUMENTS

| | | | | |
|---|---|---|---|---|
| 4,320,338 A | * | 3/1982 | Morris et al. | ............... 324/60 C |
| 4,896,114 A | * | 1/1990 | Donner | ........................ 324/522 |
| 6,181,140 B1 | * | 1/2001 | Vokey et al. | ................ 324/523 |

* cited by examiner

*Primary Examiner*—N. Le
*Assistant Examiner*—Etienne P LeRoux
(74) *Attorney, Agent, or Firm*—Larson & Taylor, PLC

(57) ABSTRACT

Open circuit faults in a cable are located by applying a step function DC voltage to one end of a conductor along the cable, for example the metallic shield along a fibre optic cable. The DC current along the conductor is measured over a sampling period and integrated to determine the capacitive charge on the cable. The distance between the end of the conductor and the open circuit fault is computed from the calculated charge and the known capacitance per unit length of the conductor. The DC current in the conductor is measured by sampling the current at a predetermined sampling frequency. The sampling frequency is preferably an integral multiple of the local AC mains power frequency, either 60 Hz or 50 Hz to eliminate the effect of induced AC voltages in the calculations. To eliminate the effects of a resistive fault, the method may include the steps of determining the conductor resistance and subtracting from the calculation of capacitive charge a DC fault current that is calculated from the conductor resistance and the DC voltage. An apparatus for carrying out the method is also disclosed.

17 Claims, 3 Drawing Sheets

OPEN CABLE LOCATING FOR SHEATHED CABLES

FIELD OF THE INVENTION

The present invention relates to the locating of an open circuit in a cable conductor.

BACKGROUND

A number of systems have been developed for monitoring the integrity and locating faults on communications cables, including fibre optic cables. One weakness of the systems developed to date has been the inability to identify the exact location of an open circuit in a monitored cable conductor. The open circuit is important to identify because if left unattended, a large section of the cable may become unmonitored, thereby reducing the effectiveness of the monitoring system.

U.S. patent application Ser. No. 09/092,849, filed Jun. 8, 1998 describes a system for locating a cable break in a conductive shield or armour of a cable. The shield is divided into sections along the cable and each section is monitored by an instrument located at the end of the section. The present application is concerned with a method for identifying the location of an open circuit in an unsegmented cable conductor, thereby helping enhance the performance and effectiveness of a monitoring system. Used in conjunction with existing cable monitoring apparatus or as a stand-alone system, the cable open locating apparatus will greatly reduce time to locate a cable "open".

Many cables are located near sources AC voltage, usually 60 Hz or 50 Hz from power mains and may have those frequencies induced in the monitored cable conductor. The preferred location method and apparatus should allow the rejection of a specified frequency and its harmonics. This can be particularly important for locating a fault in a fibre optic cable which follows the same right-of-way as high power electric utility cables.

SUMMARY

According to one aspect of the present invention there is provided a method of locating an open circuit fault in an electric conductor extending along a cable and having a unit capacitance per unit length, said method comprising:

applying a step function DC voltage to one end of the conductor;

measuring the DC current along the conductor over a sampling period;

integrating the DC current measured over the sampling period; and computing the distance between said one end of the conductor to the open circuit fault from the integrated DC current and the unit capacitance of the conductor.

For communications cables, various transmission parameters of the cable are known or can be determined. For example, with telephone long distance fibre optic cable, the parameters resistance per unit length and capacitance per unit length of the metallic cable shield are known. By capacitively charging the cable with a step function voltage, measuring and integrating the current, the charge on the shield and the total line capacitance can be calculated. Using the known capacitance per unit length, it is then possible to calculate the length of the cable to an open circuit fault.

The sampling period is sufficiently long for the DC current to reach a substantially steady state, representing a full capacitive charge on the conductor.

The DC current in the conductor is preferably measured by sampling the current at a predetermined sampling frequency. The sampling frequency is preferably an integral multiple of the local AC mains power frequency, either 60 Hz or 50 Hz, to eliminate the effect of induced AC voltages in the calculations.

To eliminate the effects of a resistive fault, the method may include the steps of determining the conductor resistance and subtracting from the calculation of capacitive charge a DC fault current that is calculated from the conductor resistance and the monitored DC voltage.

The conductor resistance may be determined by applying a DC voltage to the conductor and calculating the resistance from steady state values of the DC voltage and DC current. It is preferred to carry out multiple measurements of resistance using reversed polarity DC voltages. This cancels any diode effect in a resistive fault.

According to another aspect of the present invention there is provided, an apparatus for locating an open circuit fault in an electric conductor extending along a cable and having a unit capacitance per unit length, said apparatus comprising:

a power supply for applying a step function DC voltage to one end of the conductor;

a current meter for measuring the DC current along the conductor over a sampling period;

a processor for integrating the DC current measured over the sampling period and computing the distance between said one end of the conductor to the open circuit fault from the integrated DC current and the unit capacitance of the conductor.

The processor may include means for sampling the current at a predetermined sampling frequency.

The apparatus preferably includes a voltmeter for measuring the DC voltage at the one end of the conductor. The processor may include means for determining the conductor resistance using the voltmeter output and means for integrating the difference between the measured DC current over the sampling period and the resistive DC current calculated from the conductor resistance and the monitored DC voltage.

BRIEF DESCRIPTION OF THE DRAWINGS

In the accompanying drawings, which illustrate an exemplary embodiment of the present invention.

DETAILED DESCRIPTION

Figure 1:
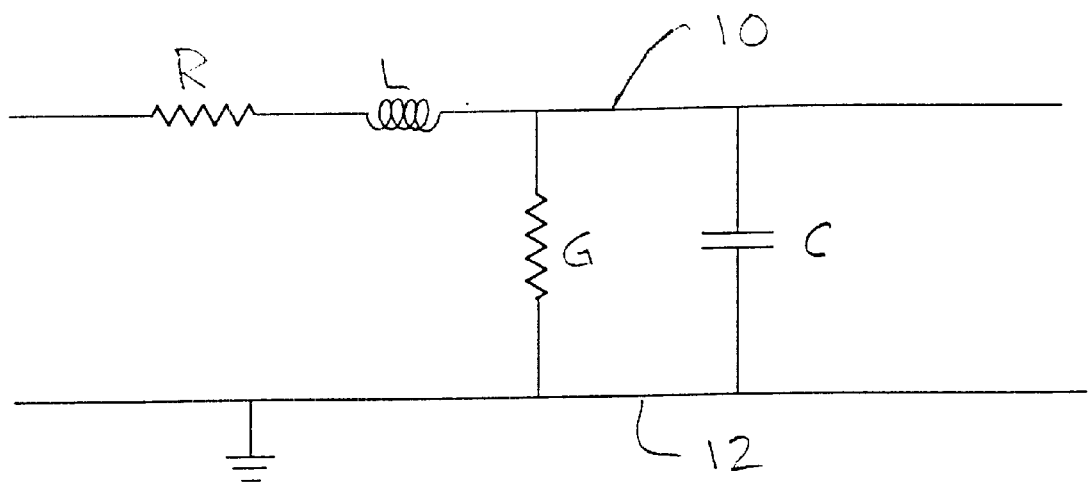
FIG. 1 is an equivalent circuit for a fault monitoring circuit.

Referring to the accompanying drawings, FIG. 1 shows an equivalent circuit for a typical monitoring circuit, represented as a lossy transmission line. This includes a monitoring conductor 10 extending the length of the cable being monitored and a ground return path 12. The conductor has a resistance represented by resistor R and an inductance represented by inductor L. It is coupled to ground by a conductance represented by resistor G and by a capacitance represented by capacitor C.

The values of the parameters, resistance, inductance, conductance and capacitance, are expressed per unit length. For example the shunt capacitor's value may be expressed as a unit capacitance, that is capacitance per unit length such as µF/km. Thus, the capacitance can be expressed as:

$$C_{TOTAL} = C_{LINE} \times \text{Length} \qquad 1$$

Where:

$C_{TOTAL}$ is the total capacitance to ground of the monitoring conductor;

$C_{LINE}$ is the unit capacitance

Length is the length of the cable

Figure 2:
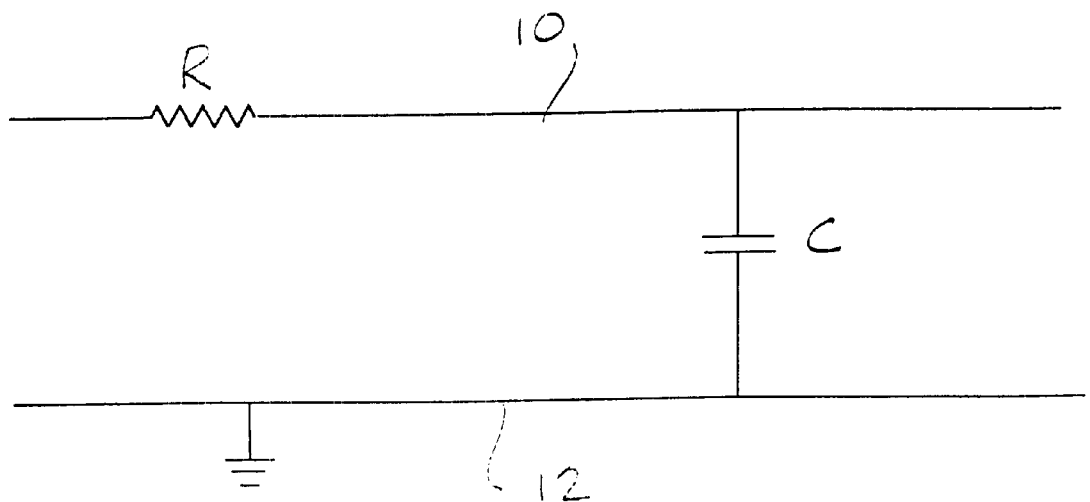
FIG. 2 is an equivalent circuit for a low frequency fault monitoring circuit.

At low frequencies the impedance $X_L(=j\omega L)$ of the inductor L is much smaller than the resistance R, and the conductance G has an impedance much greater than impedance $X_c(=j\omega C)$ of the capacitor. Therefore at low frequencies the lossy transmission line can be approximated as shown in FIG. 2, with the inductor and conductance omitted.

For applications such as a telephone long distance fibre optic cable, the metal shield or armour of the cable is used as the monitoring conductor. The primary transmission parameters for the cable shields are known. Using these known parameters, for example resistance per unit length and capacitance per unit length, it is possible to solve the problem at hand, finding the location of an open circuit fault on a cable as described in the following.

Equation 1 may be written as follows:

$$\text{Length} = \frac{C_{TOTAL}}{C_{LINE}} \qquad 2$$

Since $C_{LINE}$ is a known value it follows that the length (or distance to the open circuit fault) is easily found once we obtain the total line capacitance $C_{TOTAL}$. The measurement of the total line capacitance will now be discussed.

Figure 3:
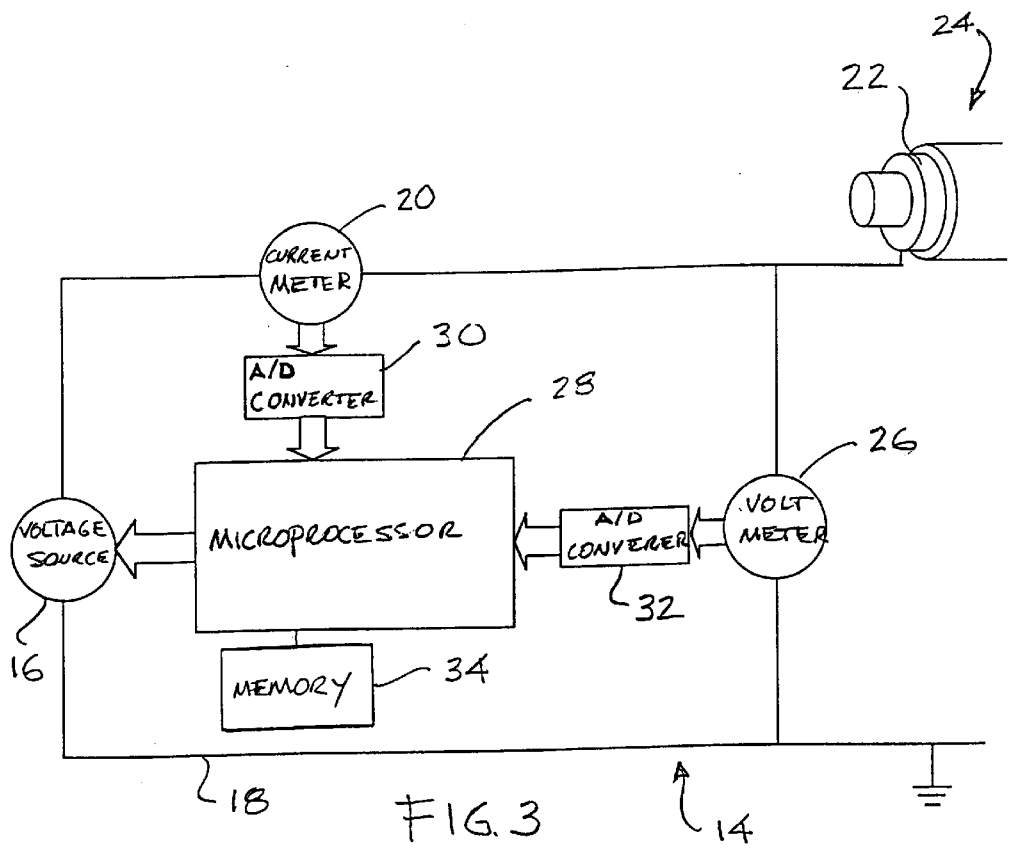
FIG. 3 is a schematic of an open circuit fault detection and location apparatus.

FIG. 3 is a schematic of an apparatus for detecting and locating open circuit faults. The apparatus 14 includes a voltage source 16 connected to ground 18 and to a current meter 20 which is in turn connected to the shield 22 of a cable 24. A voltmeter 26 is connected between ground and the cable shield 22. A microprocessor 28 is connected to the voltage source 16 to control its operation and to the current meter 20 and the voltage meter 26 through analogue to digital converters 30 and 32 respectively to read their outputs. This apparatus can apply a known voltage at a fixed time and read the current and voltage at a specified sampling frequency ($F_s$). The microprocessor 28 then stores the measurements in memory 34. With this data available, the microprocessor is able to calculate the cable capacitance and the distance to the open fault.

Formula 2 above shows that by measuring the total capacitance of cable under test, the location of the open fault can be determined. The apparatus illustrated in FIG. 3 can measure the cable's total capacitance as described in the following.

The relationship amongst the charge on a capacitor, the voltage of the capacitor, and the capacitance is described by equation 3 below. The relationship between capacitive charge and current as a function of time is given in equation 4. These combine to give equation 5 which gives the charge as a function of current and time. The charge Q is calculated by integrating the current with respect to time over a defined period.

$$C = \frac{Q}{V} \qquad 3$$

$$i(t) = \frac{\partial q(t)}{\partial t} \qquad 4$$

$$Q = \int_0^T i(t)\partial t + K \qquad 5$$

Where:

C is Capacitance in Farads (F);

Q is the charge on the capacitor in Coulombs (C);

V is the potential across the capacitor in volts (V);

i(t) is current flowing through the capacitor with respect to time in amperes (A);

K is an initial value constant.

Figure 6:
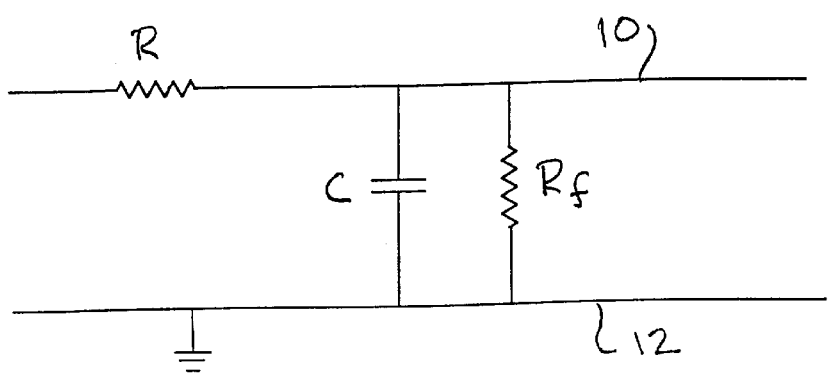
FIG. 6 is an equivalent circuit for a low frequency fault monitoring circuit with a resistive fault.
Figure 5:
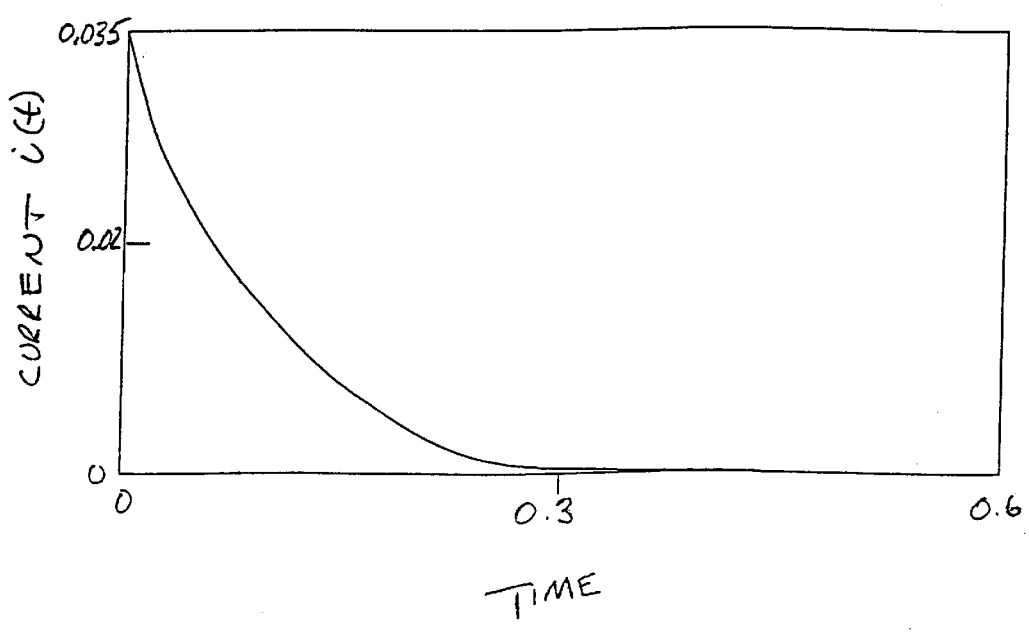
FIG. 5 is a graph of current versus time response to a step function voltage applied to the circuit of FIG. 2.

To measure the charge Q of the cable capacitance, a voltage step is applied to the armour of the cable under test. At the same instant the microprocessor begins monitoring the current flowing into the armour at a given sampling frequency ($F_s$) over a time period T. The period T is long enough that the current approaches its infinite limit. FIGS. 5 and 6 show the typical response of a long fibre optic cable with 47 µF capacitance and 1650 $\phi$ sheath resistance.

Figure 4:
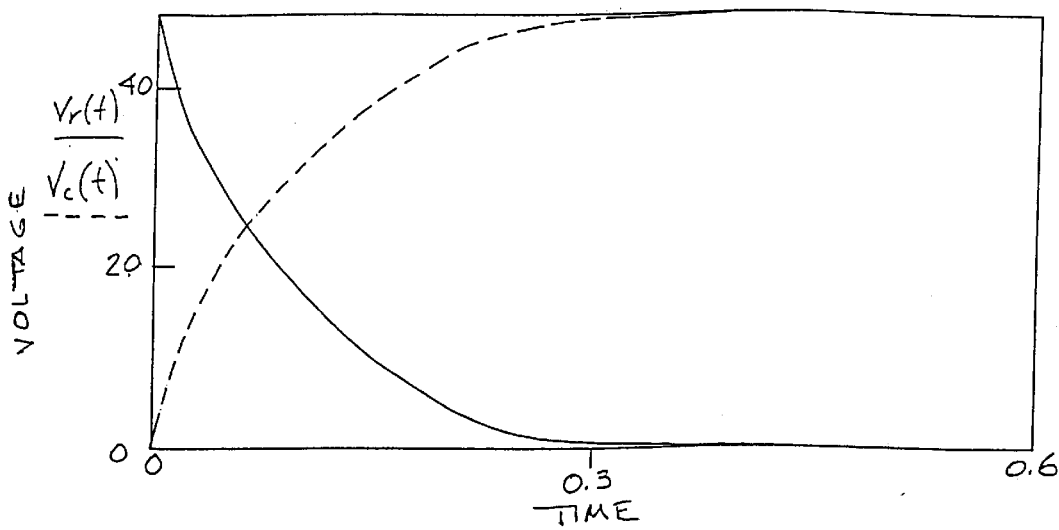
FIG. 4 is a graph of voltage versus time showing the resistive and capacitive voltage responses to a step function voltage applied to the circuit of FIG. 2.

FIG. 4 shows the voltage Vr(t) across the series resistance R of the conductor 10 illustrated in FIG. 2. For the specific parameters given, the graph shows that the voltage drop across the equivalent resistor R approaches 0 after about 300 ms. This agrees with the current shown in FIG. 5, as the series current drops to a negligible value, so does the voltage drop across the resistor. Secondly, the graph in FIG. 4 shows the voltage Vc(t) across the equivalent capacitance C of the conductor 10. Again, the voltage across the capacitor approaches the applied voltage after about 300 ms. Since the capacitor looks like an open circuit at this time and the voltage drop due to the series resistance goes to 0, the voltage measured by the apparatus in FIG. 3 accurately describes the voltage across the transmission line's capacitance (V from equation 3).

The current measurement samples must be read at a high enough frequency ($F_s$) to get an accurate numerical integration of the current. Since the current measurement samples are read by a microprocessor through an analogue to digital converter, the sampling rate can be easily controlled for the desired rate. The integration is fairly easy to perform numerically. The numerical integration is simply the area under the curve i(t). Since the sampling frequency is a finite value in real life, the integration can be approximated using the trapezoid rule as shown by equation 6.

$$Q = \int_0^T i(t)\partial t + K \cong \frac{1}{2F_s}\left\{i(0) + 2\sum_{k=1}^{k=T-1} i(k) + i(T)\right\} + K \qquad 6$$

Where:

$F_s$ is the sampling frequency;

i(0) is the current at the beginning of the sampling period;

T is the sampling period; and

K is an initial value constant.

Substituting this into equation 2, the length of the cable to the open is then calculated using equation 7.

$$L = \frac{1}{2F_s V_f C_{LINE}} \left\{ i(0) + 2 \sum_{k=1}^{k=T-1} i(k) + i(T) \right\} + K \quad 7$$

Where:
  L is length of conductor from said one end to the open circuit fault;
  $V_f$ is the steady state capacitor voltage; and
  $C_{LINE}$ is the capacitance per unit length of the conductor;

Fibre optic and other cables can be placed in all kinds of harsh environments. Many times 60 Hz, 50 Hz or other frequency AC voltages will be induced on the cable under test. This can present multiple problems, corrupting the calculation of the charge Q on the cable, which would render any results invalid. In such a case, unwanted AC signals must be eliminated. Low pass or high pass filters are not a viable option because they could remove much of the information needed to perform a meaningful integration.

To remove this unwanted noise, the integration is performed over a very specific period T. The period is long enough that the current and voltage reach steady state. The apparatus in FIG. 3 can easily measure the minimum period by applying a step voltage to an uncharged cable and measuring the voltage and current until they reach steady state. After the minimum period has been determined the integration period T is selected to be a direct multiple of the period of the unwanted signal and longer than the minimum frequency determined. This method is effective in eliminating unwanted signals because the integration of a sinusoidal or other periodic signal over an integral multiple of the signal period equals 0. The processor provides precise clocking of the sampling frequency, so that the voltage and current can be read over the selected period to reject the unwanted induced AC noise.

Additional problems arise with a resistively faulted cable. The lossy transmission line equivalent circuit at low frequencies for a cable under test with a fault resistance is shown in FIG. 6. A fault resistance $R_f$ is shown between the monitored conductor 10 and ground 12, representing the resistive fault.

In calculating the total charge (Q) on the line the extra DC current component due to the resistive fault causes the area under the curve i(t) (FIG. 5) to be greater than it should be, therefore the capacitance measurement becomes erroneous. A method has been devised to help eliminate the effect of this DC current offset.

Before the capacitance measurement algorithm is performed, a DC voltage is applied to the cable under test. Once the steady state voltage and current have been reached, the voltage and current are recorded, and the total DC resistance (Rdc) is calculated according to equation 8. This total DC resistance equals the fault resistance $R_f$ plus the cable's sheath resistance R (equation 9). To ensure accuracy, positive and negative DC voltages are applied to the cable under test and the total DC resistance is calculated in both polarities. This compensates for a diode effect, which sometimes occurs on cable faults.

$$Rdc = \frac{V_{steadystae}}{I_{steadystate}} \quad 8$$

$$Rdc = R + Rf \quad 9$$

Since the voltage applied to the cable can be measured, the current error due to the fault resistance can be calculated and subtracted it from the calculation of the total charge Q to eliminate the DC errors. A formula for the charge on the cable (Q) incorporating these changes, can be derived as follows.

$$i_{Rf}(t) = \frac{v(t)}{R_{DC}} \quad 10$$

Where:
  $i_{Rf}(t)$ is the resistive fault current; and
  v(t) is the applied voltage.

Using equation 6 and subtracting the resistive fault current:

$$Q = \int_0^T (i(t) - i_{Rf}(t)) \partial t + K =$$
$$\int_0^T i(t) \partial t - \int_0^T i_{Rf}(t) \partial t + K = \int_0^T i(t) \partial t - \frac{1}{R_{dc}} \int_0^T v(t) \partial t + K \quad 11$$

Where:
  T is the integration period; and
  K is the initial value constant.

Now using the trapezoid rule, the charge on a cable with a resistive fault is:

$$Q \cong \frac{1}{F_S} \left\{ i(0) + 2 \sum_{k=1}^{k=T-1} i(k) + (T) \right\} -$$
$$\frac{1}{2F_S R_{dc}} \left\{ v(0) + 2 \sum_{k=1}^{k=T-1} v(k) + v(T) \right\} + K \quad 12$$

Where:
  $F_s$ is the current sampling frequency; and
  v(0) is the voltage at the beginning of the sampling period.

Substituting this total charge from equation 12 into equation 3 we can obtain the total line capacitance. Since the capacitance per unit length is known and linear, equation 2 can be used to calculate the total distance to an open fault even on a cable with a resistively faulted conductor as follows.

$$L = \frac{1}{2F_s V_f C_{LENGTH}} \left[ \left\{ i(0) + 2 \sum_{k=1}^{k=T-1} i(k) + i(T) \right\} - \frac{1}{2F_S R_{dc}} \left\{ v(0) + 2 \sum_{k=1}^{k=T-1} v(k) + v(T) \right\} \right] + K \quad 13$$

where:
  L is length of conductor to the open circuit fault;
  $F_s$ is the sampling frequency;
  $V_f$ is the steady state capacitor voltage;
  $C_{LENGTH}$ is the capacitance per unit length of the conductor;
  i(0) is the current at the beginning of the sampling period;
  i is the monitored current;
  T is the sampling period;
  $i_{Rf}$ is the resistive DC current; and
  K is an initial value constant.

The apparatus described and illustrated in FIG. 3 can therefore be used to measure the total cable capacitance, and hence the distance to a cable "open" on a resistively faulted or non-faulted cable. With the microprocessor controller at the heart of the apparatus, a user interface can easily be added to make this into a portable instrument. Also, the apparatus may be incorporated into existing cable monitoring equipment to enhance its performance and effectiveness. The apparatus can be used to determine when a monitored section of cable becomes removed or "open" and determine the location of the open.

While one embodiment of the present invention has been described in the foregoing, it is to be understood that other embodiments are possible within the scope of the invention. The invention is to be considered limited solely by the scope of the appended claims.

What is claimed is:

1. A method of locating an open circuit fault in an electric conductor extending along a cable and having a unit capacitance per unit length, said method comprising:

applying a step function DC voltage to one end of the conductor;

measuring the DC current into the conductor at said one end over a sampling period;

integrating the DC current measured over the sampling period; and computing the distance between said one end of the conductor to the open circuit fault from the integrated DC current and the unit capacitance of the conductor.

2. A method according to claim 1 comprising selecting the sampling period to be sufficiently long for the DC current to reach a substantially steady state.

3. A method according to claim 2 comprising measuring the DC current into the conductor by sampling the current at a predetermined sampling frequency.

4. A method according to claim 3 wherein the sampling frequency is an integral multiple of an AC mains power frequency.

5. A method according to claim 3 wherein the sampling frequency is selected from the group consisting of 50 Hz, 60 Hz and harmonics thereof.

6. A method according to claim 3 comprising calculating the distance between said one end of the conductor and the open circuit fault using:

$$L = \frac{1}{2F_s V_f C_{LINE}} \left\{ i(0) + 2 \sum_{k=1}^{k=T-1} i(k) + i(T) \right\} + K$$

where:

L is length of conductor from said one end to the open circuit fault;

$F_s$ is the sampling frequency;

$V_f$ is the steady state capacitor voltage;

$C_{LINE}$ is the capacitance per unit length of the conductor;

i(0) is the current at the beginning of the sampling period;

T is the sampling period; and

K is an initial value constant.

7. A method according to claim 1 wherein the conductor is a conductive shield of the cable.

8. A method of locating an open circuit fault in an electric conductor extending along a cable and having a unit capacitance per unit length, said method comprising:

determining a conductor resistance;

applying a step function DC voltage to one end of the conductor;

monitoring the DC voltage at said one end of the conductor over a sampling period monitoring the DC current into the conductor at said one end over said sampling period;

integrating the difference between the monitored DC current over the sampling period and a resistive DC current calculated from the conductor resistance and the monitored DC voltage;

computing the distance between said one end of the conductor to the open circuit fault from the integrated difference and the unit capacitance of the conductor.

9. A method according to claim 8 comprising determining the conductor resistance by:

applying a DC voltage to one end of the conductor;

monitoring the DC voltage and DC current;

allowing the DC voltage and DC current to reach steady state; and calculating the conductor resistance from steady state values of the DC voltage and DC current.

10. A method according to claim 8 comprising determining the conductor resistance by:

applying a positive DC voltage to said one end of the conductor;

monitoring the positive DC voltage and DC current at said one end of the conductor;

allowing the positive DC voltage and DC current to reach steady state;

determining steady state values of the positive DC voltage and DC current;

applying a negative DC voltage to said one end of the conductor;

monitoring the negative DC voltage and DC current at said one end of the conductor;

allowing the negative DC voltage and DC current to reach steady state;

determining steady state values of the negative DC voltage and DC current; and calculating the conductor resistance from the steady state values of the positive and negative DC voltages and currents.

11. A method according to claim 8 comprising monitoring the DC current along the conductor by sampling the current at a predetermined sampling frequency.

12. A method according to claim 11 wherein the sampling frequency is an integral multiple of an AC mains power frequency.

13. A method according to claim 11 wherein the sampling frequency is selected from the group comprising 50 Hz, 60 Hz and harmonics thereof.

14. A method according to claim 11 comprising calculating the distance between said one end of the conductor and the open circuit fault using:

$$L = \frac{1}{2F_s V_f C_{LENGTH}} \left[ \left\{ i(0) + 2 \sum_{k=1}^{k=T-1} i(k) + i(T) \right\} - \left\{ i_{Rf}(0) + 2 \sum_{k=1}^{k=T-1} i_{Rf}(k) + i_{Rf}(T) \right\} \right] + K$$

where:

L is length of conductor from said one end to the open circuit fault;

$F_s$ is the sampling frequency;

$V_f$ is the steady state capacitor voltage;

$C_{LENGTH}$ is the capacitance per unit length of the conductor;

i(0) is the current at the beginning of the sampling period;

i is the monitored current;

T is the sampling period;

$i_{Rf}$ is the resistive DC current; and

K is an initial value constant.

15. An apparatus for locating an open circuit fault in an electric conductor extending along a cable and having a unit capacitance per unit length, said apparatus comprising:

a power supply for applying a step function DC voltage to one end of the conductor;

a current meter for measuring the DC current into the conductor at said one end over a sampling period;

a processor for integrating the DC current measured over the sampling period and computing the distance between said one end of the conductor to the open circuit fault from the integrated DC current and the unit capacitance of the conductor.

16. An apparatus according to claim 15 wherein the processor comprises means for sampling the current at a predetermined sampling frequency.

17. An apparatus according to claim 15 including a voltage meter for measuring the DC voltage at said one end of the conductor; and wherein the processor includes means for determining a conductor resistance, means for integrating the difference between the measured DC current over the sampling period and a resistive DC current calculated from the conductor resistance and the monitored DC voltage.

* * * * *